(12) United States Patent
Lee

(10) Patent No.: US 8,801,950 B2
(45) Date of Patent: Aug. 12, 2014

(54) REDUCTION OF A PROCESS VOLUME OF A PROCESSING CHAMBER USING A NESTED DYNAMIC INERT VOLUME

(75) Inventor: James F. Lee, Damascus, OR (US)

(73) Assignee: Novellus Systems, Inc., San Jose, CA (US)

( * ) Notice: Subject to any disclaimer, the term of this patent is extended or adjusted under 35 U.S.C. 154(b) by 197 days.

(21) Appl. No.: 13/403,215

(22) Filed: Feb. 23, 2012

(65) Prior Publication Data

US 2012/0231628 A1 Sep. 13, 2012

Related U.S. Application Data

(60) Provisional application No. 61/449,914, filed on Mar. 7, 2011.

(51) Int. Cl.
*H01L 21/302* (2006.01)
*C23F 1/08* (2006.01)
*C23C 16/44* (2006.01)
*C23C 16/00* (2006.01)

(52) U.S. Cl.
USPC ...... 216/58; 438/694; 257/E21.214; 118/715; 118/733; 156/345.29; 427/248.1; 427/569

(58) Field of Classification Search
None
See application file for complete search history.

(56) References Cited

U.S. PATENT DOCUMENTS

| | | | | |
|---|---|---|---|---|
| 4,990,047 A | * | 2/1991 | Wagner et al. | 414/217 |
| 5,314,574 A | * | 5/1994 | Takahashi | 438/706 |
| 5,716,534 A | * | 2/1998 | Tsuchiya et al. | 216/67 |
| 5,883,017 A | * | 3/1999 | Tepman et al. | 438/800 |
| 5,997,962 A | * | 12/1999 | Ogasawara et al. | 427/535 |
| 6,084,763 A | * | 7/2000 | Hirano et al. | 361/234 |
| 6,106,737 A | * | 8/2000 | Tomoyasu et al. | 216/67 |
| 6,183,564 B1 | * | 2/2001 | Reynolds et al. | 118/719 |
| 6,320,737 B1 | * | 11/2001 | Hirano et al. | 361/234 |
| 6,409,837 B1 | * | 6/2002 | Hillman | 118/712 |
| 6,426,477 B1 | * | 7/2002 | Koshimizu et al. | 219/121.41 |
| 6,576,860 B2 | * | 6/2003 | Koshimizu et al. | 219/121.43 |
| 6,818,560 B1 | * | 11/2004 | Koshimizu et al. | 438/706 |
| 8,103,492 B2 | * | 1/2012 | Brcka | 703/6 |
| 8,475,623 B2 | * | 7/2013 | Kaise et al. | 156/345.24 |
| 2001/0029971 A1 | * | 10/2001 | Farmer et al. | 134/56 R |
| 2003/0141017 A1 | * | 7/2003 | Fujisato | 156/345.47 |
| 2003/0198754 A1 | * | 10/2003 | Xi et al. | 427/576 |
| 2004/0050327 A1 | * | 3/2004 | Johnson et al. | 118/715 |
| 2004/0173162 A1 | * | 9/2004 | Rosenstein et al. | 118/733 |

(Continued)

OTHER PUBLICATIONS

Notification of Transmittal of the International Search Report and the Written Opinion of the International Searching Authority or the Declaration for PCT/US2012/027070 dated Feb. 29, 2012, 10 pages.

*Primary Examiner* — Allan Olsen

(57) ABSTRACT

A substrate processing chamber includes a lift actuator that moves a pedestal between a substrate loading position and a substrate processing position. An adjustable seal defines an expandable sealed volume between a bottom surface of the pedestal and a bottom surface of the substrate processing chamber and is moveable between the substrate loading position and the substrate processing position. When the pedestal is in the substrate processing position, the pedestal and the adjustable seal define a first inert volume and a first process volume. When the pedestal is in the substrate loading position, the pedestal and the adjustable seal define a second inert volume and a second process volume. The second inert volume is less than the first inert volume and the second process volume is greater than the first process volume.

19 Claims, 4 Drawing Sheets

(56) References Cited

U.S. PATENT DOCUMENTS

| | | | |
|---|---|---|---|
| 2004/0182833 A1* | 9/2004 | Fink | 219/121.43 |
| 2004/0221808 A1 | 11/2004 | Kawano | |
| 2005/0150458 A1* | 7/2005 | Fink | 118/723 E |
| 2006/0213439 A1* | 9/2006 | Ishizaka | 118/715 |
| 2009/0156013 A1* | 6/2009 | Yousif et al. | 438/725 |
| 2011/0024399 A1* | 2/2011 | Kim et al. | 219/121.41 |

* cited by examiner

REDUCTION OF A PROCESS VOLUME OF A PROCESSING CHAMBER USING A NESTED DYNAMIC INERT VOLUME

CROSS REFERENCE TO RELATED APPLICATIONS

This application claims the benefit of U.S. Provisional Patent Application Ser. No. 61/449,914, filed on Mar. 7, 2011, which is hereby incorporated by reference in its entirety.

FIELD

The present disclosure relates to semiconductor processing chambers.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Some semiconductor processing systems employ chemical vapor deposition (CVD), plasma-enhanced CVD (PECVD), atomic layer deposition (ALD), plasma-enhanced ALD (PEALD) and/or conformal film deposition (CFD) to deposit thin films on a substrate in a processing chamber. To create the film, one or more precursors need to be supplied to the processing chamber. A delivery system may be used to controllably deliver vaporized precursor to the processing chamber. When the film has been deposited, the precursor gas is evacuated from the processing chamber. Generally, the precursor gas is delivered at a predetermined concentration. Therefore, the volume in the processing chamber has an impact on the amount of precursor gas that is needed. As can be appreciated, the precursor gas may be relatively expensive.

SUMMARY

This section provides a general summary of the disclosure, and is not a comprehensive disclosure of its full scope or all of its features.

A substrate processing chamber includes a lift actuator that moves a pedestal between a substrate loading position and a substrate processing position. An adjustable seal defines an expandable sealed volume between a bottom surface of the pedestal and a bottom surface of the substrate processing chamber and is moveable between the substrate loading position and the substrate processing position. When the pedestal is in the substrate processing position, the pedestal and the adjustable seal define a first inert volume and a first process volume. When the pedestal is in the substrate loading position, the pedestal and the adjustable seal define a second inert volume and a second process volume. The second inert volume is less than the first inert volume and the second process volume is greater than the first process volume.

In other features, the lift actuator comprises a first bellows and the adjustable seal comprises a second bellows. The substrate loading position of the first bellows corresponds to an expanded position and the substrate processing position of the first bellows corresponds to a contracted position. The substrate loading position of the second bellows corresponds to a contracted position and the substrate processing position of the second bellows corresponds to an expanded position.

In other features, a controller maintains a predetermined pressure difference between the process volume and the inert volume. The controller adjusts positions of the lift actuator and the adjustable seal. The first inert volume is greater than the first process volume.

A method includes using an adjustable seal to define an expandable sealed volume between a bottom surface of a pedestal and a bottom surface of a substrate processing chamber; and moving a pedestal of a substrate processing chamber between a substrate loading position and a substrate processing position. The method includes defining a first inert volume and a first process volume when the pedestal is in the substrate processing position. The method includes defining a second inert volume and a second process volume when the pedestal is in the substrate loading position. The second inert volume is less than the first inert volume and the second process volume is greater than the first process volume.

In other features, the method includes moving the pedestal using a first bellows and forming the adjustable seal using a second bellows. When moving to the substrate loading position, the method includes expanding the first bellows and contracting the second bellows. When moving to the substrate processing position, the method includes expanding the second bellows and contracting the first bellows.

In other features, the method includes maintaining a predetermined pressure difference between the process volume and the inert volume. The first inert volume is greater than the first process volume.

Further areas of applicability will become apparent from the description provided herein. The description and specific examples in this summary are intended for purposes of illustration only and are not intended to limit the scope of the present disclosure.

BRIEF DESCRIPTION OF DRAWINGS

The present disclosure will become more fully understood from the detailed description and the accompanying drawings, wherein.

DESCRIPTION

Figure 1:
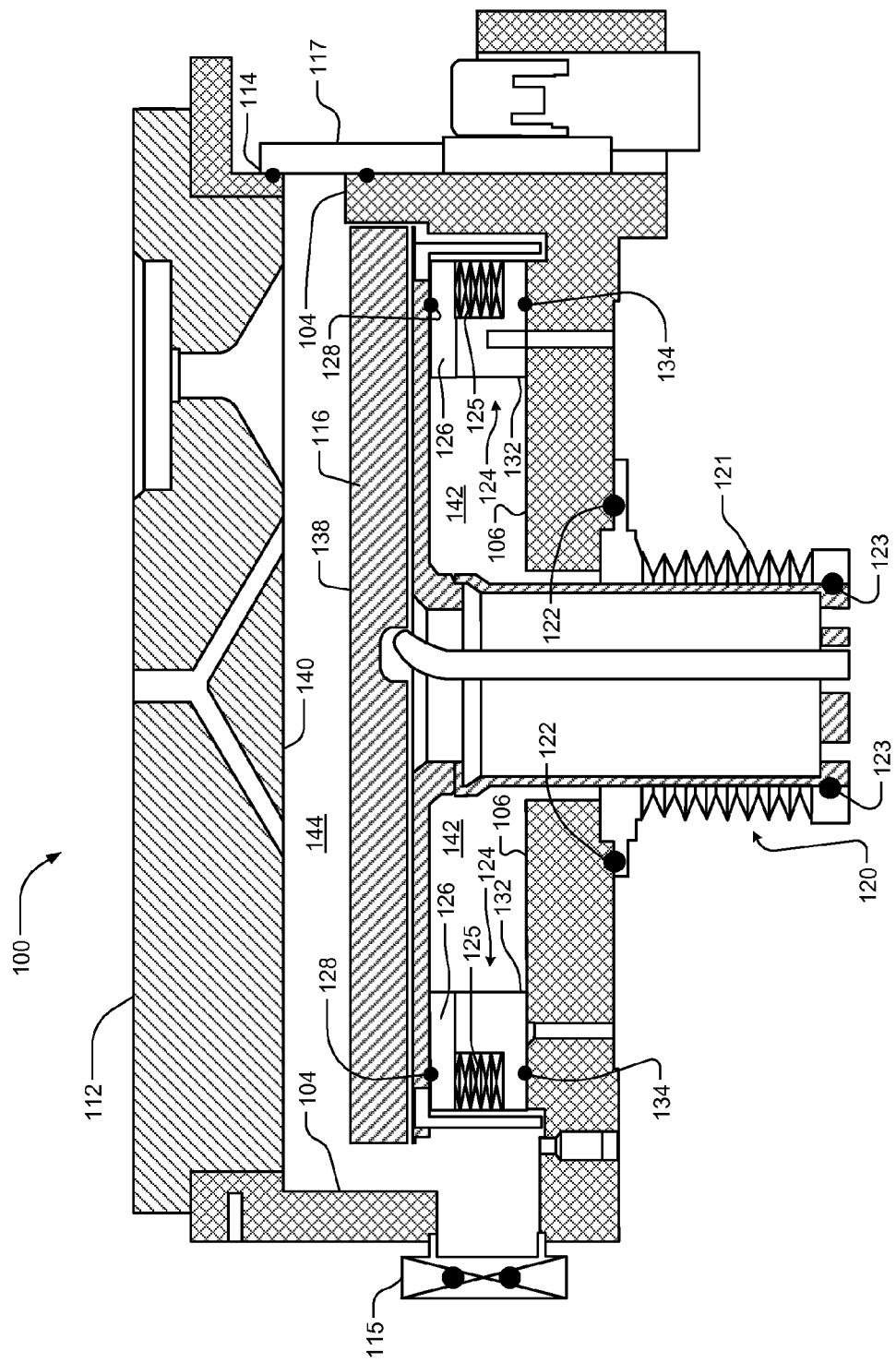
FIG. 1 is a side cross-sectional view of a processing chamber in a loading position according to the present disclosure.
Figure 2:
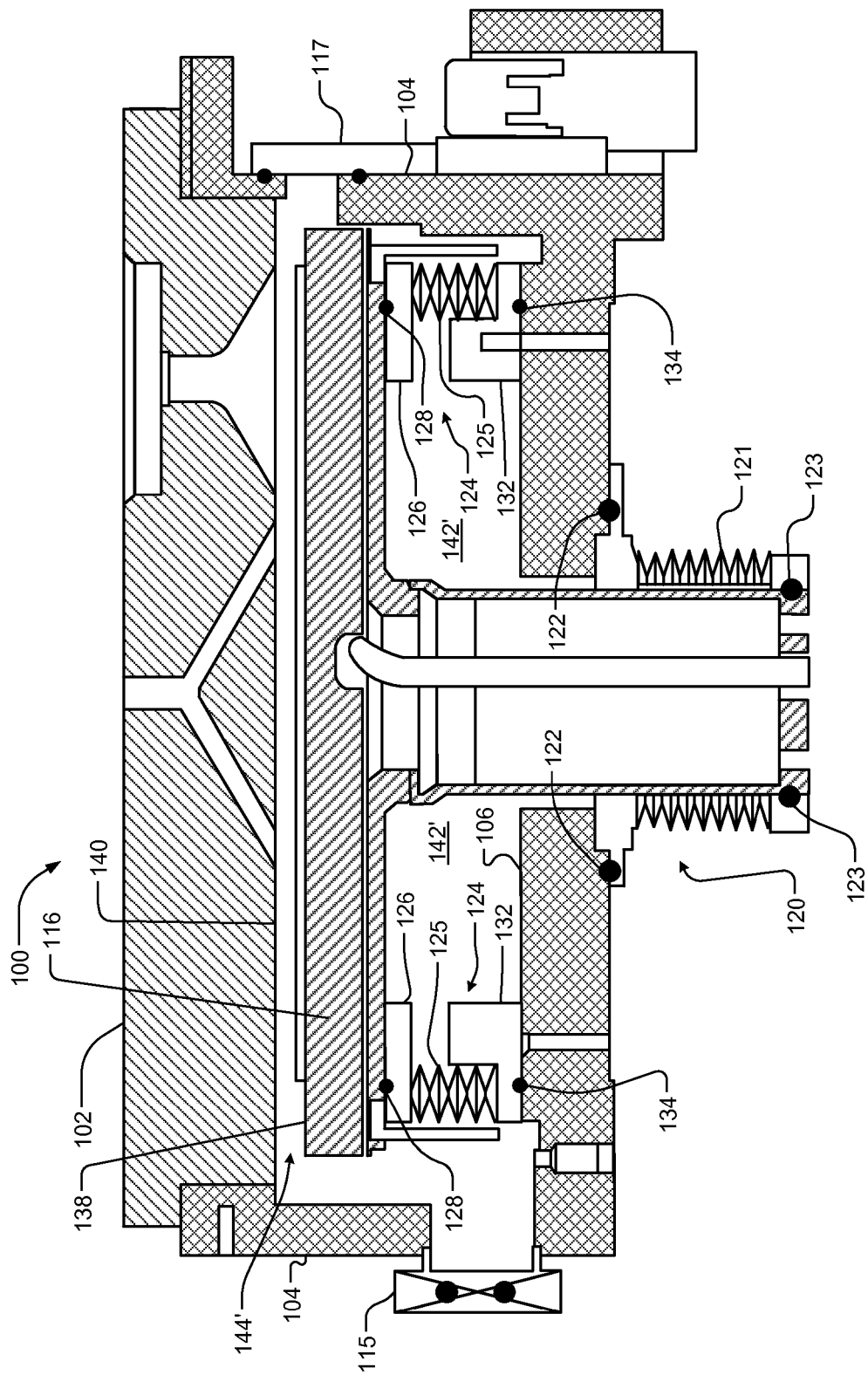
FIG. 2 is a side cross-sectional view of a processing chamber in a processing position according to the present disclosure.

Referring now to FIGS. 1 and 2, an example of a processing chamber 100 according to the present disclosure is shown. The processing chamber 100 reduces process volume, which reduces the cost of process chemicals (such as precursor) that are used during substrate processing. The processing chamber 100 includes side chamber walls 104 and a bottom surface 106. The processing chamber 100 includes a lid 112 that is shown in a closed position. One or more seals 114 may be used to seal the lid 112. The processing chamber 100 may include an isolation valve 115 and a slit valve plate 117, although other types of valves and plates may be used. The processing chamber 100 further includes a pedestal 116 that moves between a loading position (as shown in FIG. 1) and a processing position (as shown in FIG. 2).

A lift actuator 120 may be provided to move the pedestal 116 relative to the processing chamber 100. In some examples, the lift actuator 120 may comprise a first bellows 121, although other devices may be used. Seals 122 and 123 may be provided to seal the lift actuator 120 and the bottom surface 106 of the processing chamber 100 from atmospheric pressure.

An adjustable seal structure 124 defines an expandable sealed volume between the bottom surface of the pedestal and the bottom surface 106 of the processing chamber 100. In some examples, the adjustable seal structure 124 includes a second bellows 125, although other devices may be used. The adjustable seal structure 124 includes an upper portion 126 arranged adjacent to a bottom surface of the pedestal 116. A seal 128 is arranged between the bottom surface of the pedestal 116 and the upper portion 126 of the adjustable seal structure 124. The adjustable seal structure 124 includes a lower portion 132 arranged adjacent to the bottom surface 106 of the processing chamber 100. A seal 134 is arranged between the bottom surface 106 of the processing chamber 100 and the lower portion 132 of the adjustable seal structure 124.

In use, the pedestal 116 may be moved between the substrate loading position shown in FIG. 1 and the substrate processing position shown in FIG. 2 using the lift actuator 120 and the adjustable seal structure 124. To move from the substrate loading position to the substrate processing position, the lift actuator 120 contracts to move the pedestal 116 while the adjustable seal structure seal structure 124 expands to maintain a seal. An upper surface 138 of the pedestal 116 moves closer to a bottom surface 140 of the lid 112.

In FIG. 1, a first inert volume 142 is defined between the lift actuator 120, the adjustable seal structure 124, the bottom surface of the pedestal 116 and the bottom surface 106 of the processing chamber 100. A first process volume 144 is defined between the lid 112, side walls 104, the bottom surface 106 of the processing chamber and the adjustable seal structure 124. As can be seen, the first inert volume 142 of FIG. 1 is smaller than a second inert volume 142' of FIG. 2 while the first process volume 144 of FIG. 1 is larger than a second process volume 144' in FIG. 2.

To move from the substrate processing position shown in FIG. 2 to the substrate loading position shown in FIG. 1, the lift actuator 120 expands to move the pedestal 116 while the adjustable seal structure 124 contracts to maintain a seal. An upper surface 138 of the pedestal 116 moves away from the lid 112.

In other words, the processing chamber 100 reduces processing volume by adding a secondary and isolated (sealed) inert volume under the pedestal 116 that expands from that shown in FIG. 1 as the pedestal 116 is raised into the substrate processing position. The sealed and isolated inert volume occupies the space that would otherwise be open under the pedestal 116. The process volume 144 and the inert volume 142 may be sealed from one another using O-ring seals such as seals 128 and 134 and the upper and lower portions of the first bellows 121.

For example only, the second bellows 125 may have an outer diameter that less than or equal to an outer diameter of the pedestal 116. The inner diameter of the second bellows 125 may be maximized to keep the total element span (total element span=outer diameter of the second bellows minus inner diameter of the second bellows) as small as possible.

The pressure in the inert volume may be adjusted using a controller that maintains the inert volume at a predetermined differential pressure relative to the process volume pressure. For example, the inert volume pressure may be about 10 to 20 Torr above the pressure of the process volume. Maintaining the pressure differential helps to prevent the second bellows from creating a force that is too large for the lift actuator 120 to work against.

For example only, the inert volume may reduce the process volume by greater than 50%. For example only, without sealing the inert volume as described herein, the normal process volume of the chamber may be about 4 liters. Sealing the inert volume under the pedestal as described herein reduces the process volume to about 1.25 to 1.5 liters.

Figure 3:
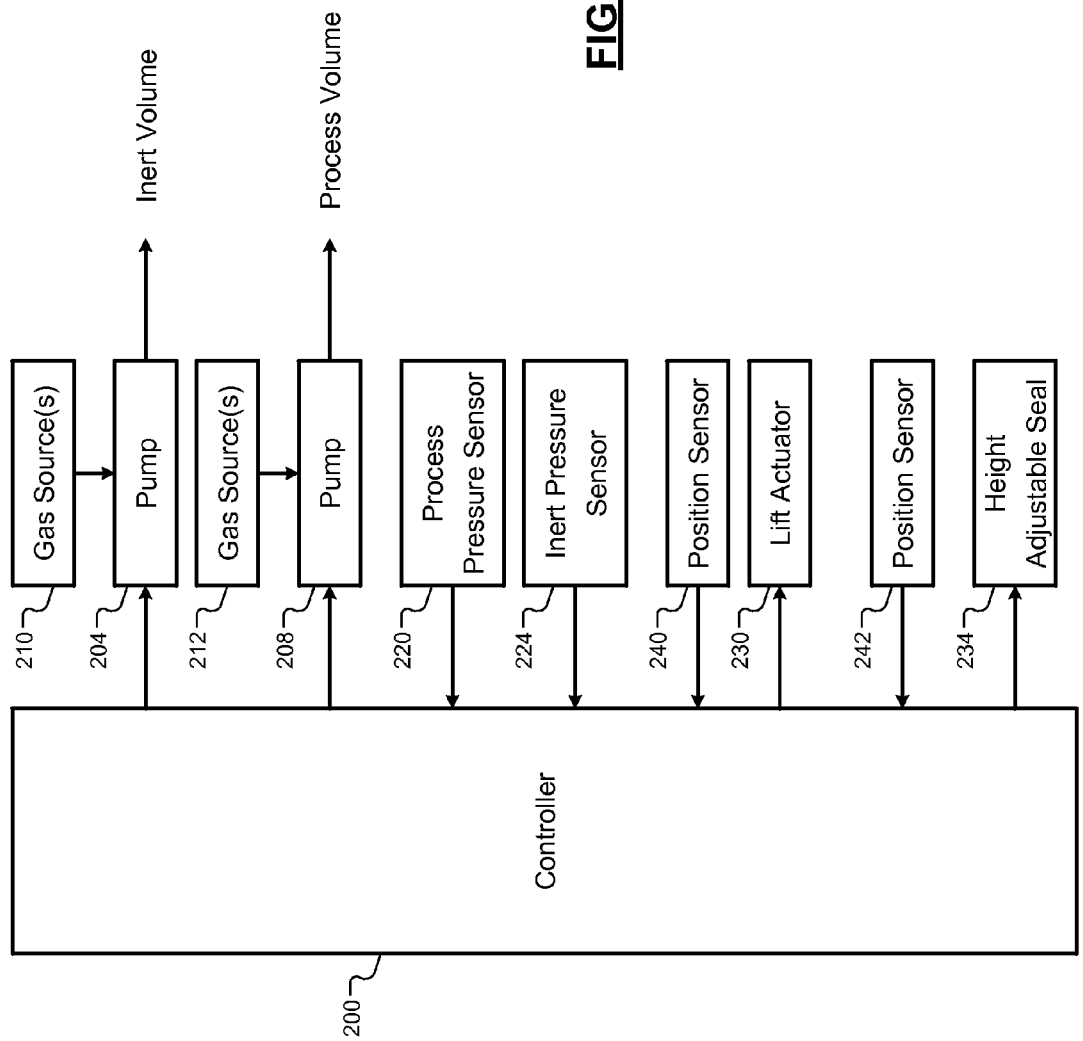
FIG. 3 is a functional block diagram of a controller according to the present disclosure.

Referring now to FIG. 3, an example of a controller 200 is shown. The controller 200 communicates with pump/valves 204 and pump/valves 208, which supply gas from gas sources 210 and 212 to the inert volume and the process volume, respectively. A process pressure sensor 220 may be used to monitor pressure in the process volume. An inert volume pressure sensor 224 may be used to monitor pressure in the inert volume. The controller 200 may also communicate with and control a lift actuator 230 and an adjustable seal 234. Position sensors 240 and 242 may be used to monitor positions of the lift actuator 230 and the adjustable seal 234.

The controller 200 may provide program instructions for implementing the above-described processes. The program instructions may control a variety of process parameters, such as pressures, gas flows, positions, etc.

Figure 4:
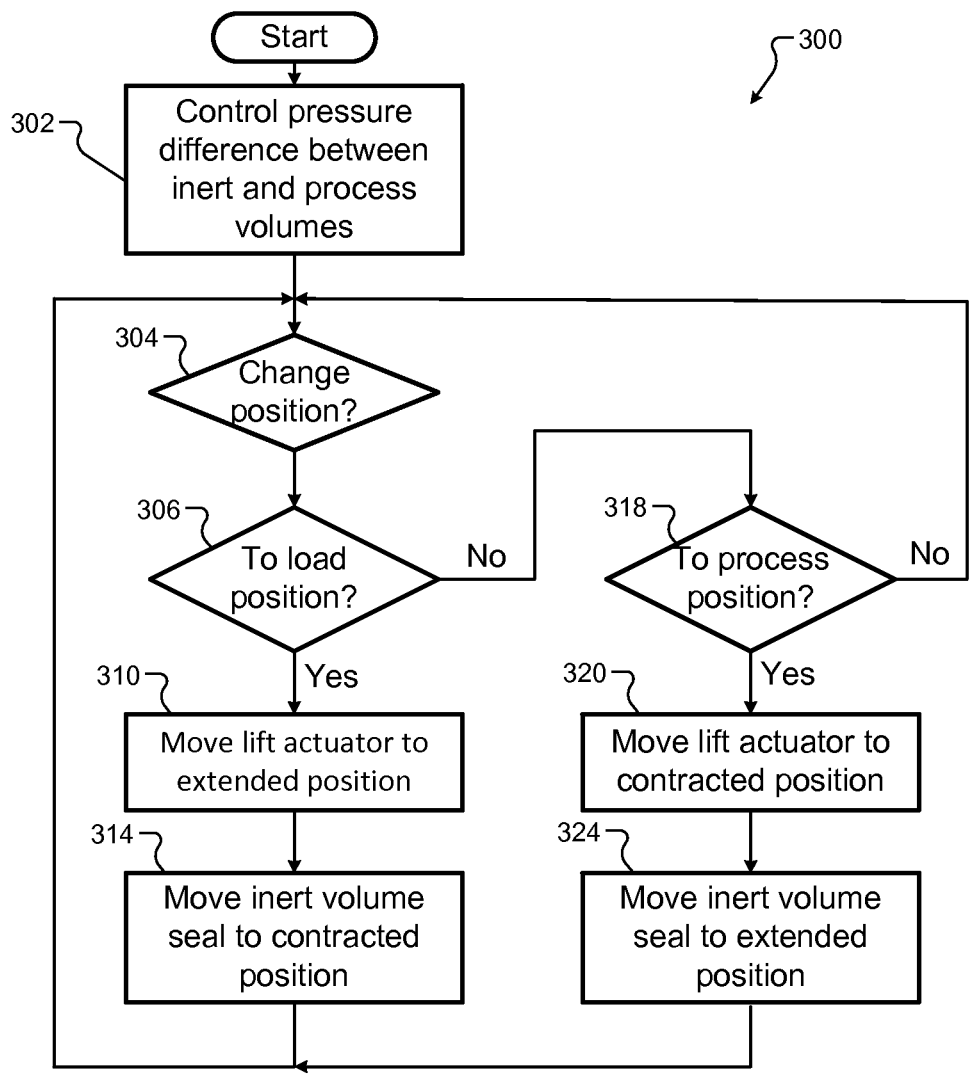
FIG. 4 illustrates an example of a method for operating the controller of FIG. 3.

Referring now to FIG. 4, an example of a method 300 is shown. At 302, control adjusts a pressure difference between the inert volume and the process volume. At 304, control determines whether a position change is needed. At 306, if the pedestal is being moved to a loading position, control moves the lift actuator to the extended position at 310. At 314, control moves the adjustable seal to a contracted position. Control returns to 304. If 306 is false and if the pedestal is being moved to the process position, control moves the actuator to the contracted position at 320. At 324, control moves the adjustable seal to the extended position. As can be appreciated, coordinated movement of the lift actuator and the adjustable seal may be performed if desired.

Chemical vapor deposition (CVD), plasma-enhanced CVD (PECVD), atomic layer deposition (ALD), plasma-enhanced ALD (PEALD), conformal film deposition (CFD) and/or other processes may be used to deposit or etch thin films on a substrate in the processing chamber. While the processing chamber can be used to deposit or etch a film, it can also be used to treat a film for a desired purpose. For example only, the processing chamber may be used to expose a low-k film to a silylating agent to repair damage to the low-k film due to a previous process step. Alternately, the film could be pre-treated or pre-cleaned to prepare the film for a subsequent process step.

When the volume is increased after processing, the pressure in the processing chamber falls significantly and quickly. In addition to reducing the cost of ownership (COO) due to the smaller volume of precursor gas that is needed, the risk of contaminating the transfer module once the gate valve is opened is also reduced since the pressure differential pushing gas back into the transfer module is lower.

The nested volume design of the processing chamber can be used in high vacuum (HV) or ultrahigh vacuum (UHV) regions of a vacuum-integrated cluster tool or located and used in a higher pressure region of a cluster tool, such as near or as part of an atmospheric pressure loadlock.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

The following description is merely illustrative in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order without altering the principles of the present disclosure.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

The invention claimed is:

1. A substrate processing system comprising:
   a substrate processing chamber including a top wall, a bottom wall and side walls;
   a pedestal that is arranged inside the substrate processing chamber when the pedestal is located in a substrate loading position and when the pedestal is located in a substrate processing position, wherein the pedestal has a top surface and a bottom surface, and wherein a substrate is supported on the top surface of the pedestal;
   a lift actuator that is connected to the bottom wall of the substrate processing chamber and the bottom surface of the pedestal and that moves the pedestal between the substrate loading position and the substrate processing position; and
   an adjustable seal that is arranged between the bottom surface of the pedestal and the bottom wall of the substrate processing chamber, wherein the adjustable seal defines an expandable sealed volume between the bottom surface of the pedestal and the bottom wall of the substrate processing chamber,
   wherein when the pedestal is in the substrate processing position, the pedestal, the lift actuator, the processing chamber, and the adjustable seal define a first inert volume and the pedestal, the substrate processing chamber, and the adjustable seal define a first process volume,
   wherein when the pedestal is in the substrate loading position, the pedestal, the lift actuator, the substrate processing chamber, and the adjustable seal define a second inert volume and the pedestal, the substrate processing chamber, and the adjustable seal define a second process volume,
   wherein the second inert volume is less than the first inert volume and the second process volume is greater than the first process volume.

2. The substrate processing system of claim 1, wherein the lift actuator comprises a first bellows and the adjustable seal comprises a second bellows.

3. The substrate processing system of claim 2, wherein:
   the substrate loading position of the first bellows corresponds to an expanded position of the first bellows and the substrate processing position of the first bellows corresponds to a contracted position of the first bellows; and
   the substrate loading position of the second bellows corresponds to a contracted position of the second bellows and the substrate processing position of the second bellows corresponds to an expanded position of the second bellows.

4. The substrate processing system of claim 1, further comprising a controller that maintains a predetermined pressure difference between at least one of:
   the first process volume and the first inert volume; and
   the second process volume and the second inert volume.

5. The substrate processing system of claim 4, wherein the controller adjusts positions of the lift actuator and the adjustable seal.

6. The substrate processing system of claim 1, wherein the first inert volume is greater than the first process volume.

7. The substrate processing system of claim 1, wherein at least one of chemical vapor deposition and plasma-enhanced chemical vapor deposition is performed on the substrate.

8. The substrate processing system of claim 1, wherein at least one of atomic layer deposition, plasma-enhanced atomic layer deposition and conformal film deposition is performed on the substrate.

9. The substrate processing system of claim 1, wherein the substrate comprises a semiconductor wafer.

10. The substrate processing system of claim 1, wherein at least one of depositing a film on the substrate, etching a film of the substrate, pre-cleaning the substrate, pre-treating the substrate and post-treating a film of the substrate occurs in the substrate processing chamber.

11. A method comprising:
    using an adjustable seal to define an expandable sealed volume between a bottom surface of a pedestal and a bottom surface of a substrate processing chamber;
    moving a pedestal of a substrate processing chamber between a substrate loading position and a substrate processing position using a lift actuator, wherein the substrate loading position and the substrate processing position are located in the substrate processing chamber;
    defining a first inert volume using the pedestal, the lift actuator, the substrate processing chamber, and the adjustable seal and a first process volume using the pedestal, the substrate processing chamber, and the adjustable seal when the pedestal is in the substrate processing position; and
    defining a second inert volume using the pedestal, the lift actuator, the substrate processing chamber, and the adjustable seal and a second process volume using the pedestal, the substrate processing chamber, and the adjustable seal when the pedestal is in the substrate loading position,
    wherein the second inert volume is less than the first inert volume and the second process volume is greater than the first process volume.

12. The method of claim 11, wherein:
    the lift actuator includes a first bellows; and
    the adjustable seal includes a second bellows.

13. The method of claim 12, further comprising:
    when moving to the substrate loading position, expanding the first bellows and contracting the second bellows; and
    when moving to the substrate processing position, expanding the second bellows and contracting the first bellows.

14. The method of claim 11, further comprising maintaining a predetermined pressure difference between at least one of:
   the first process volume and the first inert volume; and
   the second process volume and the second inert volume.

15. The method of claim 11, wherein the first inert volume is greater than the first process volume.

16. The method of claim 11, further comprising performing at least one of chemical vapor deposition and plasma-enhanced chemical vapor deposition on the substrate.

17. The method of claim 11, further comprising performing plasma-enhanced atomic layer deposition, plasma-enhanced atomic layer deposition and conformal film deposition on the substrate.

18. The method of claim 11, wherein the substrate comprises a semiconductor wafer.

19. The method of claim 11, further comprising, in the substrate processing chamber, performing at least one of:
   depositing a film on the substrate;
   etching a film of the substrate;
   pre-cleaning the substrate;
   pre-treating the substrate; and
   post-treating a film of the substrate.

* * * * *